US007016798B2

(12) United States Patent
Boerstler et al.

(10) Patent No.: US 7,016,798 B2
(45) Date of Patent: Mar. 21, 2006

(54) METHOD OF EXTRACT GATE DELAY PARAMETER IN HIGH FREQUENCY CIRCUITS

(75) Inventors: David Boerstler, Round Rock, TX (US); Eskinder Hailu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/891,759

(22) Filed: Jul. 15, 2004

(65) Prior Publication Data

US 2006/0015283 A1 Jan. 19, 2006

(51) Int. Cl.
*G06F 11/00* (2006.01)

(52) U.S. Cl. ......................... 702/79; 324/160; 326/104

(58) Field of Classification Search ................. 702/79, 702/64, 117–118, 57–59, 110, 189, 190; 324/605, 324/617, 160, 161; 257/202, 203; 326/9, 326/12, 39, 40, 104, 128
See application file for complete search history.

(56) References Cited

U.S. PATENT DOCUMENTS 3,629,712 A * 12/1971 Clark .......................... 327/12
6,002,282 A * 12/1999 Alfke ......................... 327/165

* cited by examiner

*Primary Examiner*—Edward Raymond
(74) *Attorney, Agent, or Firm*—Carr LLP; Diana R. Gerhardt

(57) ABSTRACT

The present invention provides for determining gate speed parameters in a circuit. A first delay is selected. A second delay is selected, wherein the second delay is longer than the first delay. A clock signal is delayed as a function of the first delay. The clock signal is combined with the first delayed clock signal. A first pulse signal is produced from combining the clock signal with the first delayed clock signal. A clock signal is delayed as a function of the second delay. The clock signal is combined with the first delayed clock signal. A second pulse signal is produced from combining the clock signal with the second delayed clock signal. The first delayed clock signal is integrated. The second delayed clock signal is integrated. The first delayed integrated clock signal is compared with the second delayed integrated clock signal. When the first delayed integrated clock signal is greater than the second integrated clock signal, the gate delay is determined.

20 Claims, 4 Drawing Sheets

METHOD OF EXTRACT GATE DELAY PARAMETER IN HIGH FREQUENCY CIRCUITS

TECHNICAL FIELD

The present invention relates generally to circuit modeling and, more particularly, to the extraction of gate delay parameters of a circuit.

BACKGROUND

Semiconductor manufacturers typically test and calibrate their products prior to being shipped, so that the shipped performance will meet performance specifications. This is of special relevance in "high speed" circuits, such as microprocessors, phase-locked loops, radio frequency circuits, where calibration can result in performance variation of over an order of magnitude.

One key calibration parameter is transistor gate delay. This parameter, which can vary from wafer to wafer as well as from die to die largely determines many important performance parameters of the chip. Hence, in the case of microprocessors, for example, the vendors typically need to be able to measure the gate delay of the various gates within the chip.

However, there are some problems associated with conventional technologies. For instance, gate transmission testers typically require extra equipment and chip space. This can be a significant problem when trying to reduce the amount of overhead required for efficient design.

Therefore, there is a need for a method and/or apparatus to determine gate delay parameters in a manner that addresses at least some of the concerns of conventional gate parameter testers.

SUMMARY OF THE INVENTION

The present invention provides for determining gate speed parameters in a circuit. A first delay is selected. A second delay is selected, wherein the second delay is longer than the first delay. A clock signal is delayed as a function of the first delay. The clock signal is combined with the first delayed clock signal. A first pulse signal is produced from combining the clock signal with the first delayed clock signal. A clock signal is delayed as a function of the second delay. The clock signal is combined with the first delayed clock signal. A second pulse signal is produced from combining the clock signal with the second delayed clock signal. The first delayed clock signal is integrated. The second delayed clock signal is integrated. The first delayed clock signal is compared with the second delayed clock signal.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1:
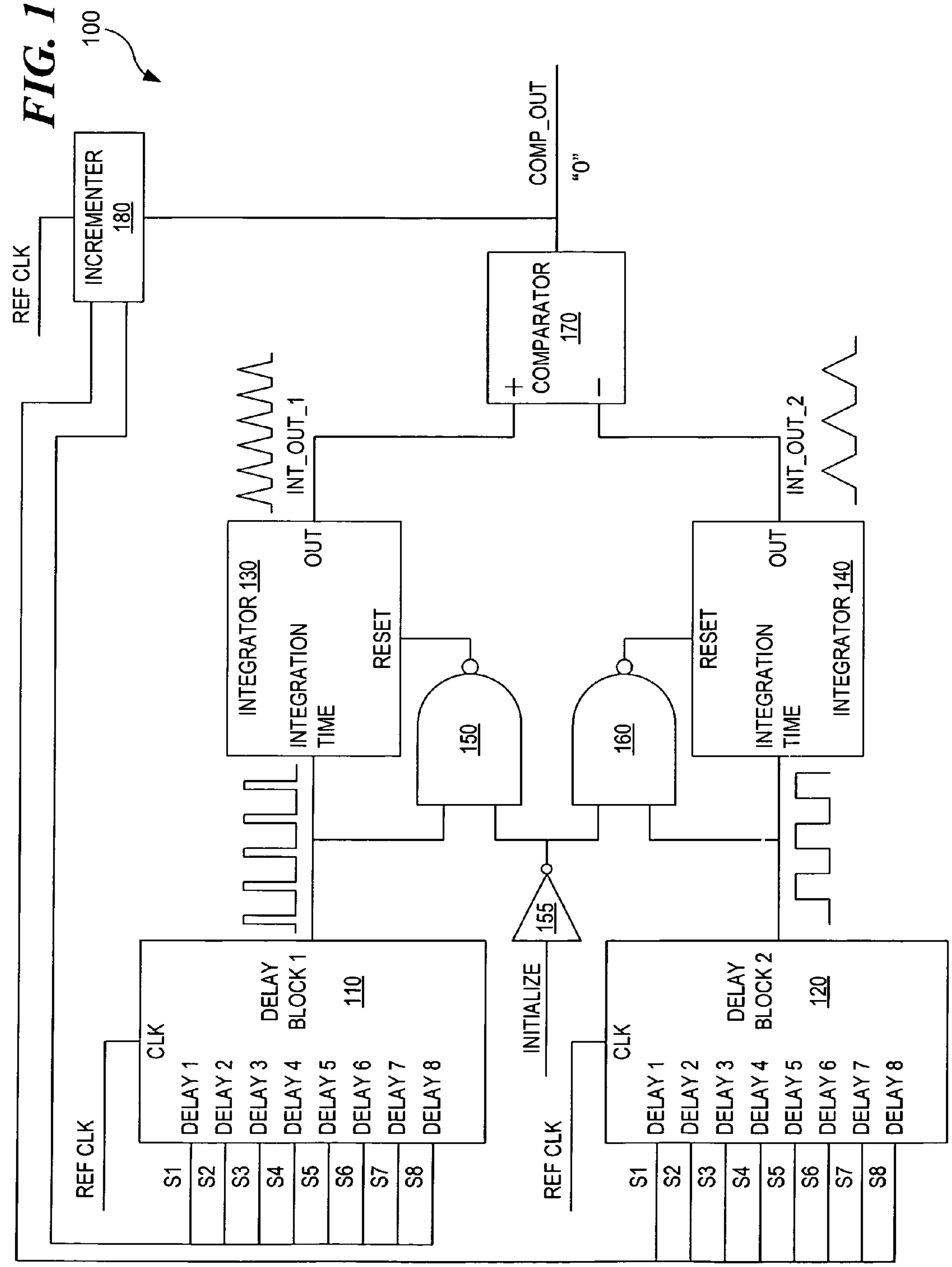
FIG. 1 schematically depicts a circuit to extract gate parameters.

Turning to FIG. 1, disclosed is a circuit 100 employable for extracting transistor gate delays in a different part of the chip, such as a microprocessor circuit. Generally, when testing the circuit, it is assumed that gates on the same chip substantially have the same gate delays. However, this gate delay time can change between individual chips due to variations in processing, and so on.

Therefore, a first delay of a given number of gates is selected for part of the chip to test gate delays. Then, substantially simultaneously, a larger number of gate relays are also tested at a second part of the chip to be tested. These delays are then integrated and compared to each other, and when a given mathematical relationship, as a function of the switching speed of a reference clock, manifests itself, each individual gate delay is the period of the reference clock divided by the number of gates employed in that particular test.

In the system 100, a delay block 1 110 is coupled to a reference clock input, REFCLK. There are also a plurality of signal inputs, S1 to S8, which select one of the delay elements, that is, DELAY 1 to DELAY 8 in 110. Each delay element takes the reference clock signal REFCLK, inverts the clock signal, and then delays it by a known number of gate transitions. The output of the delay block 1 is coupled to an integrator 130. The output of delay block 1 130 is also coupled to an NAND gate 150. The initialize signal is used to initialize the integrator 130 output when the chip is powered on. The NAND gate 150 is coupled to the reset of the integrator 130. An initialize line is coupled to the input of the NAND gate 150 through an inverter 155. The output of the integrator 130 is coupled to the input of a comparator 170. This is the INT_OUT_1 signal.

Similarly, a delay block 2 120 is also coupled to the REFCLK. There are also a plurality of signal inputs, S1 to S8 which select one of the delay elements in 120, that is, DELAY 1 to DELAY 8. Each signal S1 to S8 takes the reference clock signal REFCLK, inverts the clock period, and then delays it by a known number of gate transitions, albeit a larger number of gate transitions than is used in the delay element 110. The output of the delay block 2 120 is coupled to an integrator 140. The output of the delay block 2 120 is also coupled to a NAND gate 160. The NAND gate 160 is coupled to the reset of the integrator 140. The initialize signal is used to initialize the integrator 140 output when the chip is powered on. The initializor is also coupled to the input of the NAND gate 160 through inverter 155. The output of the integrator 140, the INT_OUT__2 signal, is coupled to the inverting input of a comparator 170.

The comparator 170 compares the INT_OUT__1 signal and the INT_OUT__2 signal to generate a COMP_OUT signal. When the INT_OUT__1 signal is greater in magnitude than the INT_OUT__2 signal, the output COMP_OUT of the comparator 170 is positive. Otherwise, the output of the COMP_OUT is negative.

If the COMP_OUT signal is negative, then the signal delay gets incremented. For instance, if INT_OUT__1 is less than INT_OUT__2, then both delay block 1 110 and delay block 2 120 increment from S1 to S2, from S5 to S6, or so on, as incremented by an incrementer logic 180.

As indicated above S1–S8 in both 110 and 120 select one of their delay elements (DELAY 1 to DELAY 8). The delays associated with delay elements in 120 are shifted with respect to their counter parts in 110. An alternative explanation is to say each delay element (DELAY N) in 120 introduces a delay that is larger than its counter part (DELAY N) IN 110. While not necessary, in this embodiment the delay elements are designed such that DELAY 1 of 120=delay 2 of 110, DELAY 2 of 120=DELAY 3 of 110, . . . . DELAY 7 OF 120=DELAY 8 of 110.

In the system 100, the reference clock signal REFCLK has a period, TREFCLK. The clock signal, REFCLK, is entered into the circuits. This clock signal is then passed through delay elements DELAY 1 TO 8 as selected by signals S1 to S8. In both 110 and 120 only one delay element is active at a given time.

Within the selected delay element (FIG. 2) REFCLK is combined via an AND gate with an inverted and delayed version of REFCLK. When REFCLK and its delayed and inverted version are both positive (high) then the AND gate will generate a pulse whose width is equal to this positive overlap. When one or the other of the two clock pulses is negative(low) the output is negative (low). The output pulse width of the selected delay element will be at a maximum when the delay introduced equals half the period of REFCLK.

In any event, signal pulses are generated as a function of the combination via an AND gate of the original REFCLK and a delayed and inverted version of it. These signal pulses are then input into integrators 130 and 140. The integrators 130 and 140 then output triangular pulses whose amplitude is directly related to the pulse width generated by the various delay elements.

In the system 100, initially 110 and 120 are initialized such that both start at their respective DELAY 1 elements. However, as indicated above, by design DELAY 1 OF 120 introduces larger delay than DELAY 1 of 110. Therefore, the amplitude of the pulse of 140 will be higher than that of 130 at first. Also as mentioned above, the maximum integrator output corresponds with the maximum pulse width from 110 and 120. Furthermore, this maximum pulse width is achieved when the delay introduced is equal to TREFCLK/2 where TREFCLK is the period of REFCLK. In other words 140 reaches at its maximum value ahead of 130. After this maximum value is reached the amplitude of 140 will start to monotonically decrease. However, while the amplitude of 140 is decreasing that of 130 is reaching its maximum. At the point where this cross over point is detected, comparator 170's output will swing from low to high. This prevents INCREMENTER 180 from incrementing its value any further.

In a further embodiment, the amplitude of the triangle wave generated from an integrator 130, 140 is stored into a memory. This would typically be done through the employment of an Analog to Digital converter to store into memory the previous amplitude of the triangle wave. In this embodiment, only integrator 130, NAND 150, and so on, would be employed, but not integrator 140 and NAND 160.

It is determined how many gates are associated with each delay element. The number of gates of a "DELAY N" (for instance a delay "3") can be described as 2bN−1, where b is an integer multiplicative constant, and greater than or equal to one. The period of REFCLK is TREFCLK. Gate delay is hereinafter denoted by Tgate. Hence, the following expression holds at the crossover point:

$$(2bn-1)\times Tgate+e=TREFCLK/2.$$

"e" is an error term that arises from the fact that each subsequent delay is increased in discrete steps. The maximum value of e is equal to the delay increment between two successive delay elements. That is:

$$\mathrm{Max}|e|=2b\times Tgate.$$

Therefore: Tgate=(TREFCLK/2−e)/(2bN−1).

It is generally desirable to minimize dependence of Tgate on "e". "e" is at its minimum when b=1. Also, the effect of e is reduced for large TREFCLK. Therefore, for a most accurate extraction of TGATE, TREFCLK should be as large as possible and b=1.

Figure 2:
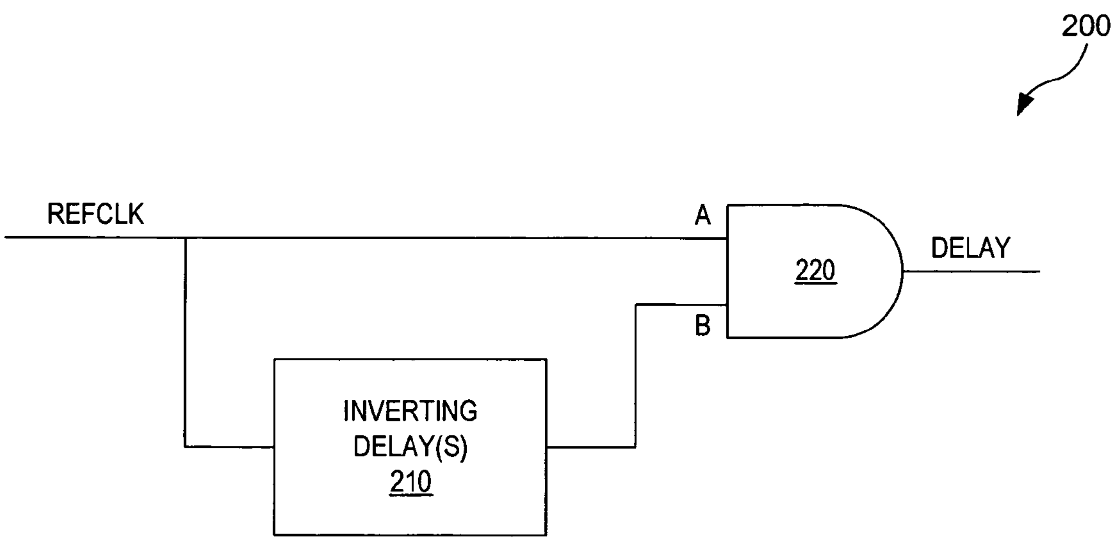
FIG. 2 illustrates an embodiment of a delay block.

Turning now to FIG. 2, illustrated is part of a delay block 110. The REFCLK is broken up into a non-inverting signal and an inverting delay(s) 210. This gives an output that is ANDed together by an AND gate 220. This creates an output pulse of various widths. Each of the inverting delay(s) 210 can have one inverter, three inverters, five inverters, and so on, or alternatively an incremental number of inverters, such as three, seven, eleven, and so on. A single inverter could correspond to S1, three inverters could correspond to S2, five inverters could correspond to S3, and so on, as selected by the incrementer 180.

Figure 3:
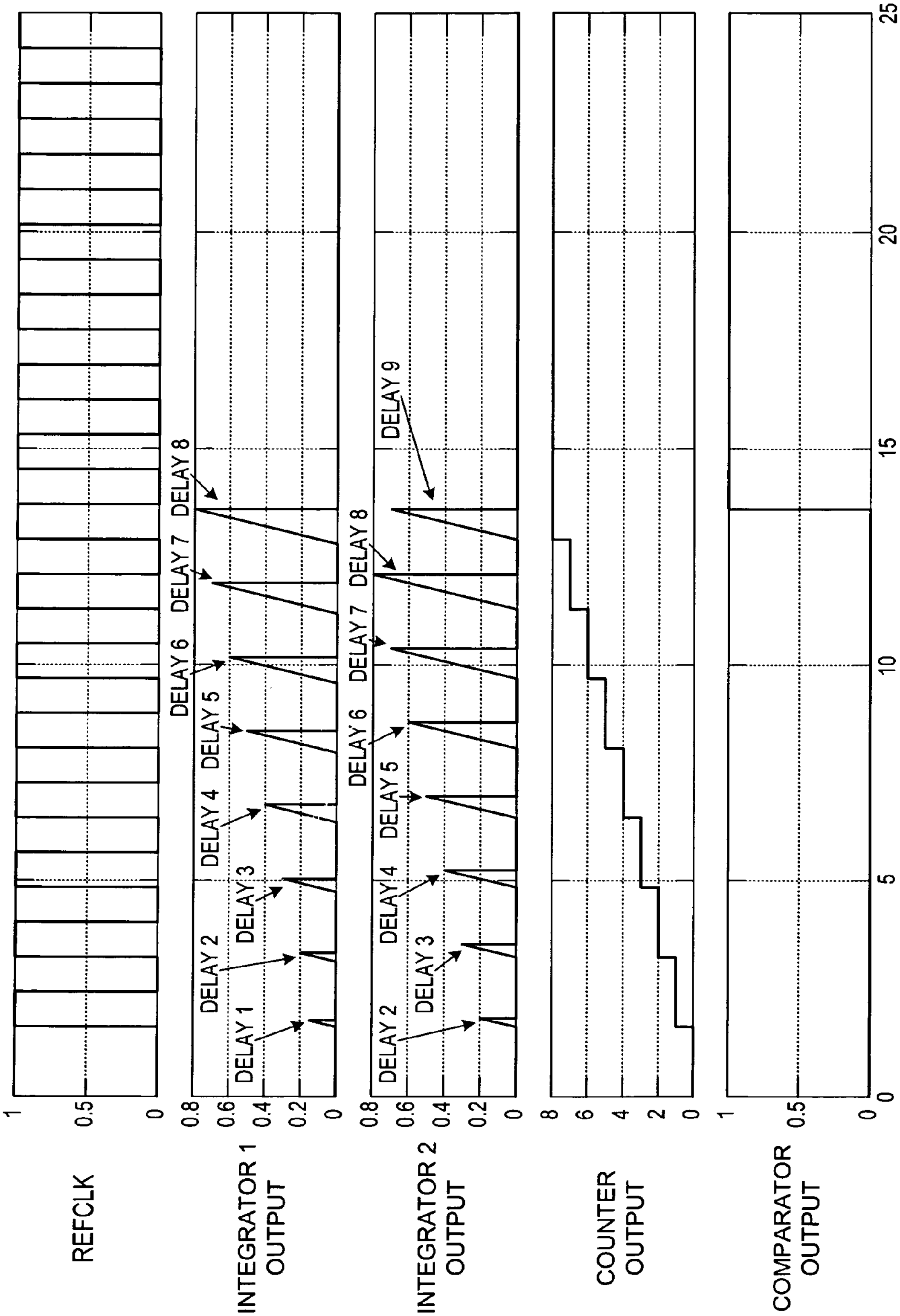
FIG. 3 illustrates a graph of the output of the comparator of FIG. 1 as the delay increases.

Turning now to FIG. 3, illustrated is a graph of signal outputs of the system 100. REFCLK is illustrated. The outputs of integrator 1 130 and integrator 2 140 are shown. Each delay leads to a larger amplitude triangular wave, up until delay 8. The integrator 2 140 output reaches its maximum at delay 8, and then starts to decrease at delay 9. The counter output of counter 180 increases up until the amplitude of the integrator 2 140 output is less than the output of integrator 1 130. This is when the comparator output, COMP_OUT goes from 0 to 1.

Figure 4:
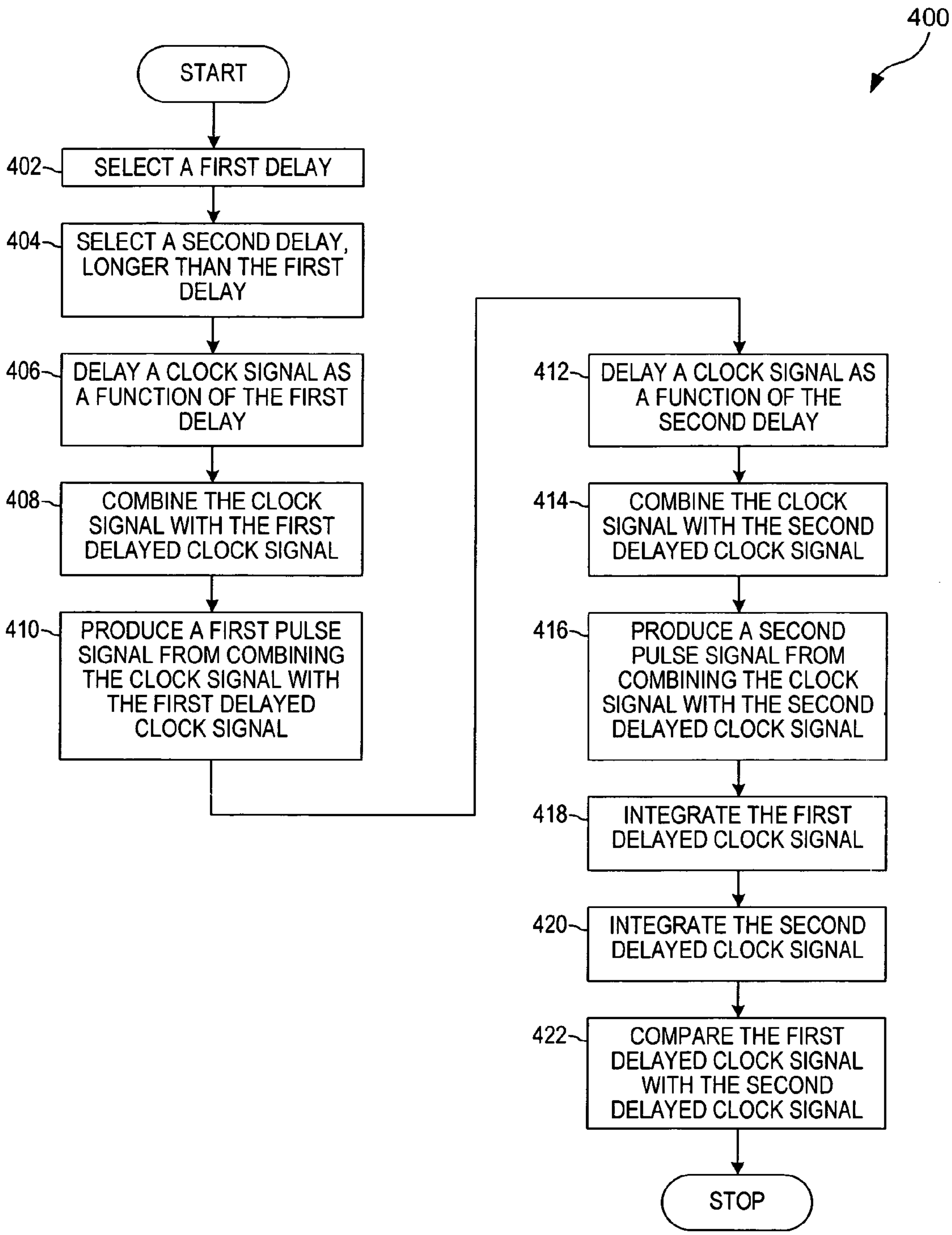
FIG. 4 is a flow chart illustrating a method for determining gate speed parameters.

Turning now to FIG. 4, illustrated is a flow chart depicting a method for determining gate speed parameters in a circuit such as the system 100. In step 402, one selects a first delay. In step 404, one selects a second delay longer than the first delay. In step 406, one delays a clock signal as a function of the first delay. In step 408, one combines the clock signal with the first delayed clock signal. In step 410, one produces a first pulse signal from combining the clock signal with the first delayed clock signal. In step 412, one delays a clock signal as a function of the second delay. In step 414, one combines the clock signal with the second delayed clock signal. In step 416, one produces a second pulse signal from combining the clock signal with the second delayed clock signal. In step 418, one integrates the first delayed clock signal. In step 420, one integrates the second delayed clock signal. In step 422, one compares the first delayed clock signal with the second delayed clock signal.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

What is claimed is:

1. A system for extracting gate parameters, comprising:
- a first delay block;
- a second delay block;
- a first NAND logic coupled to an output of the first delay block;
- a second NAND logic coupled to an output of the second delay block;
- a first integrator coupled to the output of the first delay block and an output of the first NAND logic;
- a second integrator coupled to the output of the second delay block and an output of the second NAND logic; and
- a comparator coupled to an output of the first integrator and an output of the second integrator.

2. The system of claim 1, further comprising an incrementer coupled to an output of the comparator.

3. The system of claim 2, further comprising a reference clock coupled to the first delay block and the second delay block.

4. The system of claim 2, wherein the incrementer is coupled to the first delay block and the second delay block.

5. The system of claim 4, wherein the incrementer is configured to increment a delay on the first and second delay block as a function of a selected output of the comparator and a reference clock signal.

6. The system of claim 1, further comprising an initialize input coupled to an input of the first and second NAND logic.

7. The system of claim 1, wherein the first and second delay blocks are coupled to a reference clock.

8. The system of claim 6, wherein the delay value selected by the incrementer in the second delay block is one more delay value than the delay selected by the incrementer in the first delay block.

9. The system of claim 1, wherein a delay block comprises a plurality of delays.

10. The system of claim 9, wherein each delay comprises at least one inverter.

11. The system of claim 10, wherein each delay comprises an odd number of inverters.

12. The system of claim 11, wherein the output of the odd numbers of inverters is input into an AND logic, and a reference clock signal is also input into the AND logic.

13. A method for determining gate speed parameters in a circuit, comprising:
- selecting a first delay;
- selecting a second delay, wherein the second delay is longer than the first delay;
- delaying a reference clock signal as a function of the first delay;
- combining the reference clock signal with the first delayed clock signal;
- producing a first pulse signal from combining the reference clock signal with the first delayed clock signal;
- delaying the reference clock signal as a function of the second delay;
- combining the reference clock signal with the second delayed clock signal;
- producing a second pulse signal from combining the reference clock signal with the second delayed clock signal;
- integrating the first pulse signal;
- integrating the second pulse signal; and
- comparing the first integrated pulse signal with the second integrated pulse signal.

14. The method of claim 13, further comprising incrementing the first delay.

15. The method of claim 13, further comprising incrementing the second delay.

16. The method of claim 13, further comprising generating a triangle wave of the output of the step of integrating the first delayed clock signal.

17. The method of claim 13, further comprising generating a triangle wave of the output of the step of integrating the second delayed clock signal.

18. The method of claim 13, further comprising determining a gate delay parameters by dividing the period of the reference clock signals by the number of gates in the first delay when the magnitude of the comparator indicates that the magnitude of the first integrated signal is greater than the magnitude of the second integrated signal.

19. A computer program product for determining gate speed parameters in a circuit, the computer program product having a medium with a computer program embodied thereon, the computer program comprising:
- computer code for selecting a first delay;
- computer code for selecting a second delay, wherein the second delay is longer than the first delay;
- computer code for delaying a reference clock signal as a function of the first delay;
- computer code for combining the reference clock signal with the first delayed clock signal;
- computer code for producing a first pulse signal from combining the reference clock signal with the first delayed clock signal;
- computer code for delaying the reference clock signal as a function of the second delay;
- computer code for combining the reference clock signal with the second delayed clock signal;

computer code for producing a second pulse signal from combining the reference clock signal with the second delayed clock signal;

computer code for integrating the first pulse signal;

computer code for integrating the second pulse signal; and computer code for comparing the first integrated pulse signal with the second integrated pulse signal.

20. A processor for determining gate speed parameters in a circuit, the processor including a computer program comprising:

computer code for selecting a first delay;

computer code for selecting a second delay, wherein the second delay is longer than the first delay;

computer code for delaying a reference clock signal as a function of the first delay;

computer code for combining the reference clock signal with the first delayed clock signal;

computer code for producing a first pulse signal from combining the reference clock signal with the first delayed clock signal;

computer code for delaying the reference clock signal as a function of the second delay;

computer code for combining the reference clock signal with the second delayed clock signal;

computer code for producing a second pulse signal from combining the reference clock signal with the second delayed clock signal;

computer code for integrating the first pulse signal;

computer code for integrating the second pulse signal; and computer code for comparing the first integrated pulse signal with the second integrated pulse signal.

* * * * *